(12) United States Patent
Richieri

(10) Patent No.: US 7,384,826 B2
(45) Date of Patent: Jun. 10, 2008

(54) METHOD OF FORMING OHMIC CONTACT TO A SEMICONDUCTOR BODY

(75) Inventor: Giovanni Richieri, Druento (To) (IT)

(73) Assignee: International Rectifier Corporation, El Segundo, CA (US)

(*) Notice: Subject to any disclaimer, the term of this patent is extended or adjusted under 35 U.S.C. 154(b) by 149 days.

(21) Appl. No.: 11/169,820

(22) Filed: Jun. 29, 2005

(65) Prior Publication Data

US 2006/0003514 A1 Jan. 5, 2006

Related U.S. Application Data

(60) Provisional application No. 60/584,073, filed on Jun. 29, 2004.

(51) Int. Cl.
  *H01L 21/332* (2006.01)
(52) U.S. Cl. .............. 438/140; 257/E29.012; 257/E29.013
(58) Field of Classification Search .............. 438/197, 438/597, 660, 665, 140; 257/77, 140, 484, 257/E29.012, E29.013
  See application file for complete search history.

(56) References Cited

U.S. PATENT DOCUMENTS

| | | | |
|---|---|---|---|
| 5,412,249 A * | 5/1995 | Hyugaji et al. ............. 257/745 |
| 5,980,265 A | 11/1999 | Tischler ..................... 437/185 |
| 6,528,395 B2 * | 3/2003 | Nakamura ................... 438/478 |
| 6,608,360 B2 * | 8/2003 | Starikov et al. ............ 257/481 |
| 6,881,979 B2 * | 4/2005 | Starikov et al. ............ 257/80 |
| 6,903,417 B2 * | 6/2005 | Okabe et al. ............... 257/341 |
| 6,936,850 B2 * | 8/2005 | Friedrichs et al. ............ 257/77 |
| 7,260,130 B2 * | 8/2007 | Takeuchi et al. ......... 372/46.01 |
| 2001/0055887 A1 * | 12/2001 | Nakamura ................... 438/749 |
| 2002/0019084 A1 * | 2/2002 | Francis et al. .............. 438/197 |
| 2002/0125482 A1 * | 9/2002 | Friedrichs et al. ............ 257/73 |
| 2004/0080015 A1 * | 4/2004 | Mauder et al. ............. 257/500 |
| 2004/0104395 A1 * | 6/2004 | Hagimoto et al. ............ 257/79 |
| 2004/0135166 A1 * | 7/2004 | Yamada et al. ............. 257/103 |
| 2005/0242411 A1 * | 11/2005 | Tso ............................. 257/480 |

\* cited by examiner

*Primary Examiner*—Thao Le
(74) *Attorney, Agent, or Firm*—Ostrolenk, Faber, Gerb & Soffen, LLP

(57) ABSTRACT

A process for forming an ohmic contact on the back surface of a semiconductor body includes depositing a donor layer on the back surface of the semiconductor body followed by a sintering step to form a shallow intermetallic region capable of forming a low resistance contact with a contact metal.

15 Claims, 15 Drawing Sheets

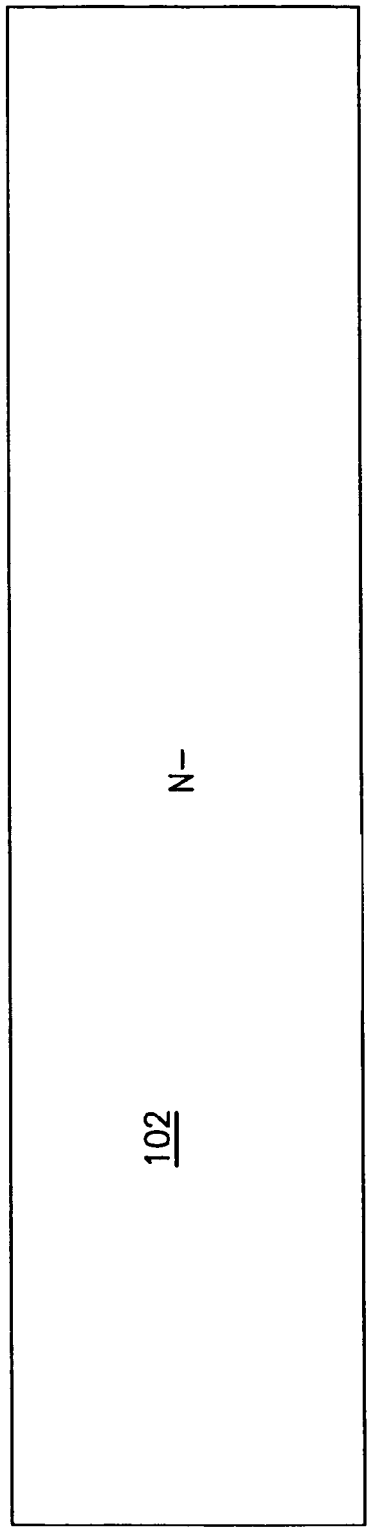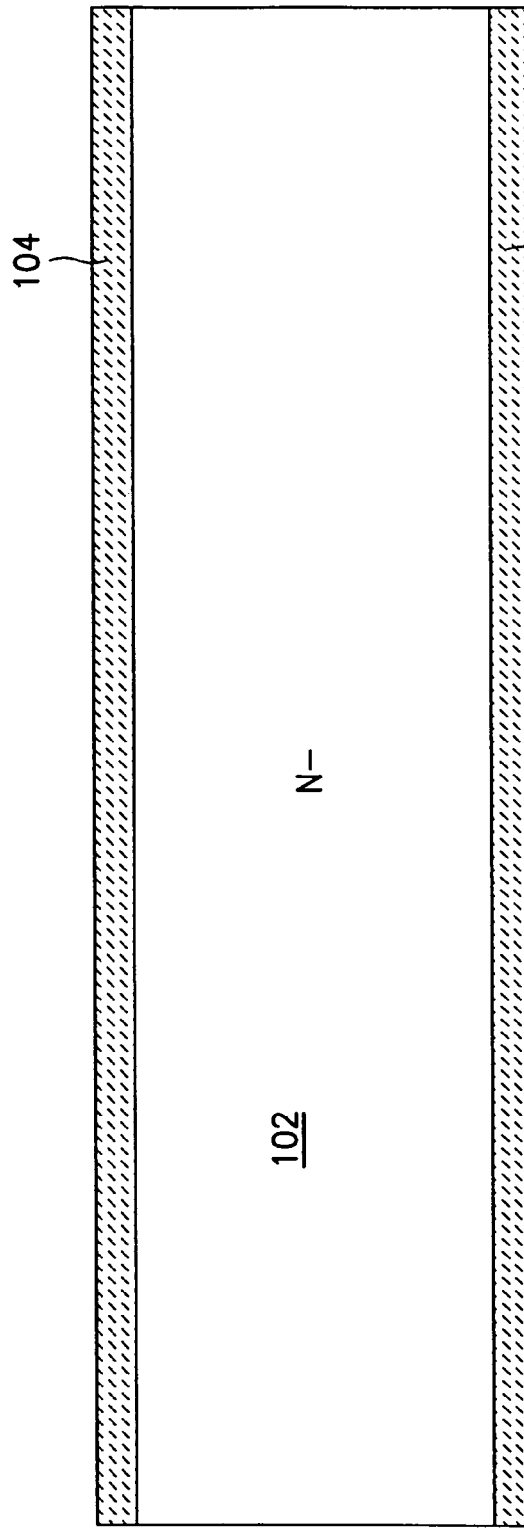

METHOD OF FORMING OHMIC CONTACT TO A SEMICONDUCTOR BODY

RELATED APPLICATIONS

This application is based on and claims priority to U.S. Provisional Application No. 60/584,073, filed Jun. 29, 2004, by Giovanni Richieri, entitled "IMPROVED OHMIC CONTACT TO SILICON CARBIDE WAFERS OR TO $N^-$ SILICON AND PROCESS THEREFOR," the contents of which are herein incorporated by reference.

BACKGROUND OF THE INVENTION

1. Field of the Invention

This invention relates generally to semiconductor devices, and more specifically, to ohmic contact structures for float zone silicon wafers and for silicon carbide wafers and to methods for fabricating such contact structures.

2. Description of Related Art

It is well known to form a semiconductor device using a semiconductor die that includes a $N^-$ epitaxial silicon layer formed atop a $N^+$ float zone silicon substrate, for example, the device being formed in the surface of the epitaxial layer and electrode contact metals being formed on the upper and back surfaces of the die. For example, a fast recovery diode (FRED) generally includes a plurality of PN junctions formed in the upper portion of the epitaxial layer and spaced by Schottky regions. A common top electrode is shared by the PN junctions and Schottky regions to form a device that includes PN and Schottky diodes. A back electrode is formed along the back surface of the $N^+$ float zone silicon substrate. The need to grow the epitaxial layer on a semiconductor die, however, makes the die expensive, whether used for a FRED or any other device.

Accordingly, it would be desirable to form a device directly in/on the surface of a float zone silicon die that does not have the epitaxial layer. Once forming device components in/on the upper surface of the die, a back surface contact metal must thereafter be formed. In a conventional device, the presence of a high conductivity region at the back surface of the die (e.g., $N^+$ or $P^+$ region) lowers the contact resistance between the contact metal and the silicon body, thereby resulting in a good ohmic contact. However, because a float zone die is usually lightly doped (e.g., $N^-$ or $P^-$) it does not form a good ohmic contact with a contact metal.

Notably, an implant can be performed along the back surface of the die to improve its capability of forming a good ohmic contact. Such a step, however, requires additional handling, which may be undesirable when an ultrathin device is desired. In addition, an implant may not be feasible when an ultrathin device is desired.

Similarly, it is known to form a device in the upper surface of a semiconductor die made of silicon carbide. Here again, a back side contact metal needs to be formed such that the contact metal makes good ohmic contact to the silicon carbide. However, the formation of such ohmic contacts has also been quite difficult to form, as described in U.S. Pat. No. 5,980,285. For example, it has been difficult to sufficiently dope the silicon carbide surface to form an $N^+$ region for contact by a contact metal.

SUMMARY OF THE INVENTION

Accordingly, it is desirable to form an ohmic contact between a contact metal and a back surface of a float zone silicon die or silicon carbide die, thereby overcoming the above and other disadvantages of the prior art. According to a preferred embodiment of the invention, components of a semiconductor device are first formed in/on the upper surface of a $N^-$ float zone silicon body using any well known process. For example, a plurality of interleaved spaced PiN diodes and Schottky contacts for a fast recovery diode may be formed into the upper surface of the silicon body, together with a termination. Thereafter, a back surface of the silicon body may be ground as by grinding and/or etching to obtain, for example, an ultrathin device. For example, the silicon body may be thinned to about 60 to 75 μm.

Thereafter, a bottom contact is made to the back surface of the $N^-$ body. Specifically, according to an embodiment of the invention, a donor layer that includes atoms capable of forming an intermetallic composition with low contact resistivity is first deposited on the back surface of the silicon body by sputtering or evaporation and is thereafter sintered at a temperature less than about 500° C. As a result, a shallow intermetallic region of $N^{++}$ conductivity is formed within the back surface of the silicon body. For example, the $N^{++}$ intermetallic region may have a depth into the back surface of the silicon body of about 0.5 to 1.6 μm. Note that the donor layer may not completely diffuse into the body, however, any un-diffused material is not removed. According to a further aspect of the invention, a thin titanium layer or a titanium-tungsten alloy layer may be placed between the donor layer and silicon body surface to enable the use of a high sinter temperature. The titanium or titanium-tungsten layer is used as promotion adhesion for the final metal.

According to the present invention, the donor layer may include an alloy of gold, such as gold with arsenic (AuAs), gold with antimony (AuSb), or gold with tin (AuSn).

Once the intermetallic region is formed, a contact metal, such as a conventional trimetal like chromium/nickel/silver, for example, is deposited over the intermetallic region, thereby forming an ohmic contact. Preferably, the depositing and heating of the donor layer and the depositing of the contact metal are performed without additional handling of the device.

According to a preferred embodiment of the invention, a similar contact process is employed for silicon carbide. Specifically, once forming components of a device in an upper surface of a silicon carbide body, a donor layer is deposited on the back surface thereof, preferably through sputtering. The donor layer is then annealed, in situ, at 350° C. to 450° C. for a few minutes creating an intermetallic region of $N^+$ conductivity within the back surface. According to the present invention, the donor layer may include an alloy of gold, such as gold with antimony (SbAu), that is sputtered to 3000 Å thick or less. Once the intermetallic region is formed, a back side contact metal, such as nickel (Ni) or an alloy of titanium, nickel, and silver (TiNiAg), for example, is then applied to the intermetallic region to form an ohmic contact.

According to a further embodiment of the invention, the above described process for forming an ohmic contact to a silicon carbide substrate surface can also be used to form an ohmic contact to a gallium nitride (GaN) substrate surface.

Other features and advantages of the present invention will become apparent from the following description of the invention, which refers to the accompanying drawings.

BRIEF DESCRIPTION OF THE DRAWINGS

FIGS. 2-13 graphically illustrate a process for fabricating the semiconductor device of FIG. 1.

DESCRIPTION OF THE EMBODIMENTS

Figure 1:
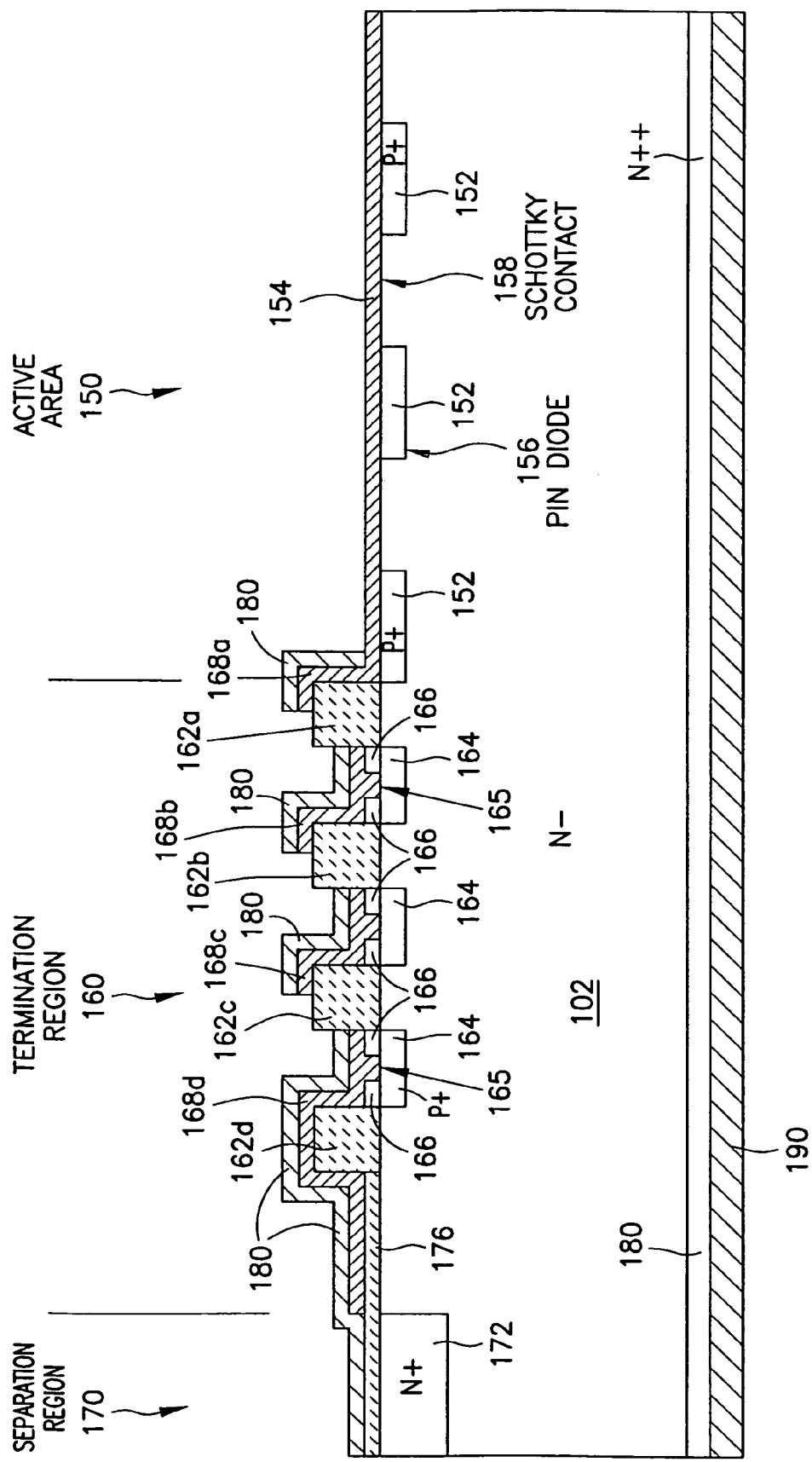
FIG. 1 shows a cross sectional view of a semiconductor device having an ohmic contact structure on a back side of a N⁻ float zone silicon body according to an embodiment of the present invention.

Referring to FIG. 1, there is shown in cross section a small portion of a semiconductor device 100 (here a fast recovery diode) with a back surface ohmic contact structure according to a preferred embodiment of the present invention (note that FIG. 1 is not drawn to scale). Specifically, device 100 includes float zone silicon body 102 of N⁻ conductivity. Within the upper surface of body 102, along active area 150, are a plurality of spaced diffusions 152 of P⁺ conductivity. A contact metal 154 (e.g., aluminum) contacts the surface of diffusions 152, thereby defining a plurality of PiN diodes 156, and further contacts the surface of body 102 between diffusions 152, thereby defining a plurality of Schottky contacts 158. As illustrated, contact metal 154 forms an anode electrode.

Termination region 160 resides at the periphery of active area 150. Termination region 160 includes a plurality of spaced field oxide rings 162a-d formed along the surface of body 102. Within the surface of body 102 are a plurality of guard rings 164 of P⁺ conductivity, each guard ring being situated between two adjacent field oxide rings 162. Atop each guard ring 164 and between adjacent field oxide rings 162 is oxide layer 166, each layer having a window/gap 165 formed therein that extends to the surface of the underlying guard ring. Over each field oxide ring is a corresponding stepped field plate 168a-d (e.g., aluminum), with field plate 168a contacting contact metal 154 and with field plates 168b-d extending through a window 165 and contacting a guard ring 164.

Laterally surrounding the die edge within separation region/cutting street 170 is N⁺ diffusion 172. Underlying field plate 168d, along the outer periphery of the termination region, and overlying diffusion 172 is oxide layer 176.

Overlying field plates 168a-d, a portion of contact metal 154, and diffusion 172 is amorphous silicon layer 180. Platinum atoms may be diffused into body 102 to act as a lifetime killer in the usual manner.

Along the back surface of body 102 is contact metal 190 (e.g., a conventional trimetal) forming a cathode electrode. According to an embodiment of the present invention, beneath contact metal 190 and within the back surface of body 102 is a shallow intermetallic region 180 of N⁺⁺ conductivity. Through intermetallic region 180, an ohmic contact is formed between contact metal 190 and body 102.

Referring now to FIGS. 2-15 (note that the Figures are not drawn to scale), there is illustrated a process for fabricating fast recovery diode 100 and in particular, a process for forming an ohmic contact between a back surface contact metal and a N⁻ float zone silicon body according to a preferred embodiment of the invention. Beginning with FIG. 2, there is illustrated a cross-section of a small portion of an initial body 102 of starting float zone silicon having a crystal orientation of <111>, a non-critical thickness of about 375 μm, and N⁻ conductivity. In this example, silicon body 102 has resistivity of about 20 to 30 ohm cm. However, this resistivity is not required and different resistivities can be used, depending on the desired voltage rating of the final device being made.

Once performing an initial clean, field oxide layers 104 and 106 are formed on the upper and back surfaces, respectively, of body 102, as illustrated in FIG. 3. Field oxide layer 104 may have a thickness, for example, of about 14,000±500 Å.

Figure 4:
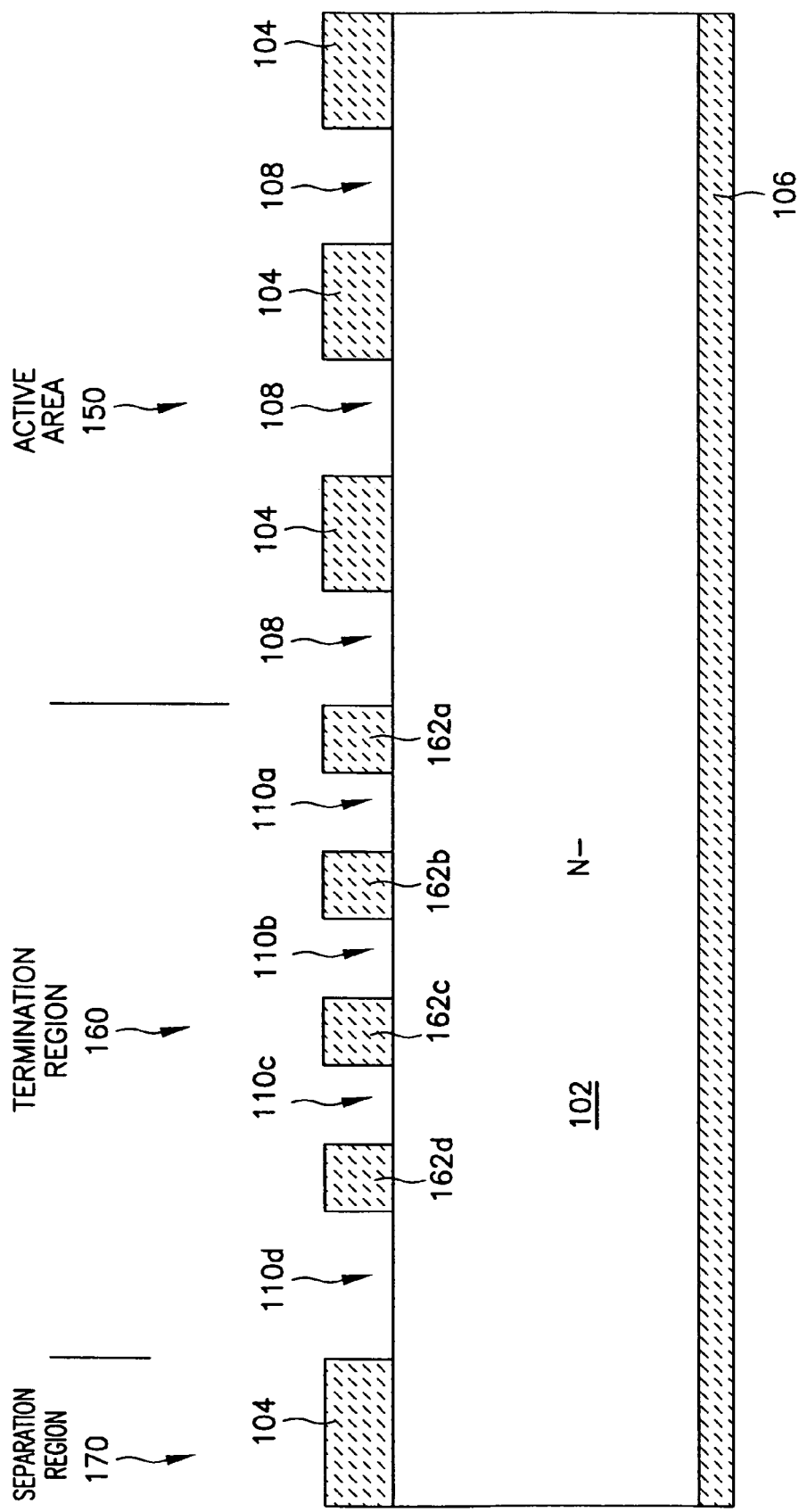

Referring to FIG. 4, a first mask is next formed on the surface of oxide layer 104 and the oxide layer is thereafter etched to the surface of body 102, thereby forming a plurality of windows 108 in active area 150 and a plurality of windows 110a-d in termination region 160. As illustrated, this etching step also forms field oxide rings 162a-d in termination region 160.

Figure 5:
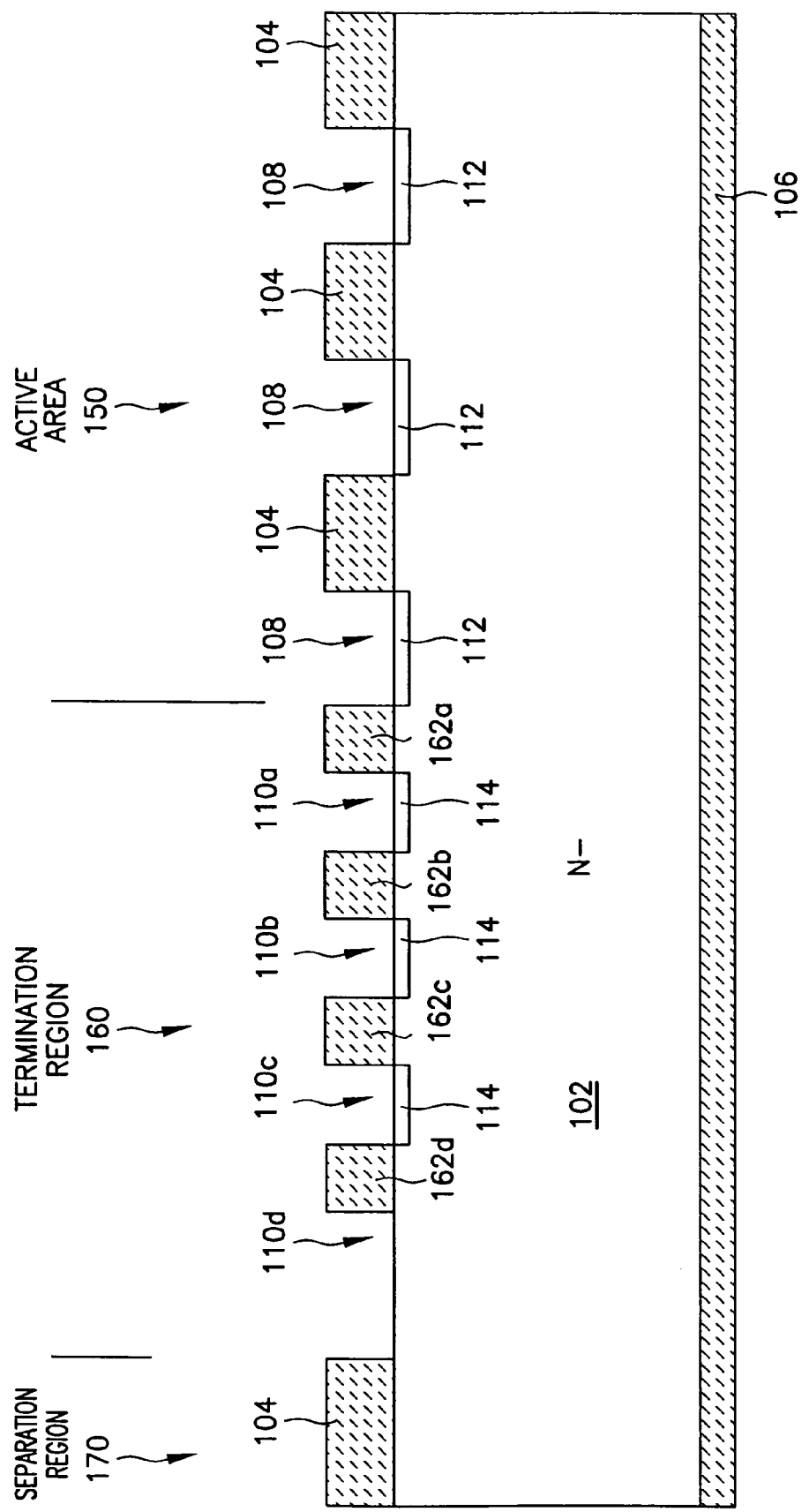

After a suitable clean, a boron implant is next carried out to deposit P type boron through windows 108 and 110a-c and into the upper surface of body 102. As a result, implant regions 112 are formed in active area 150 and implant regions 114 are formed in termination region 160, as illustrated in FIG. 5.

Figure 6:
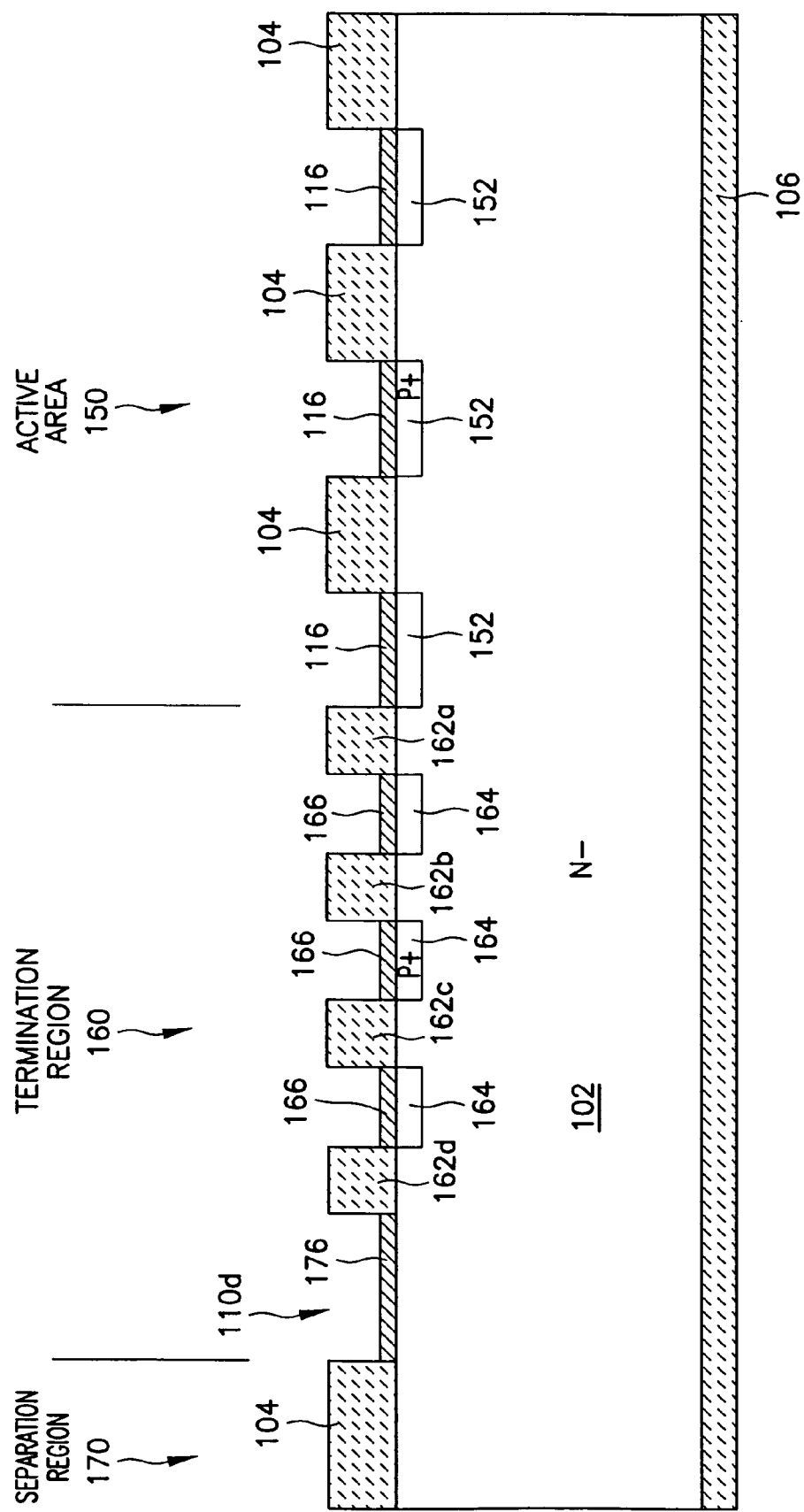

Referring to FIG. 6, after another clean, a boron oxidation step is carried out, diffusing the boron implant regions 112 and 114 and growing oxide layers 116 and 166, respectively, atop each boron diffusion. As a result, diffusions 152 of P⁺ conductivity are formed in active area 150 and guard rings 164 of P⁺ conductivity are formed in termination region 160. This oxidation step also grows oxide layer 176 along the surface of body 102 within window 110d.

Figure 7:
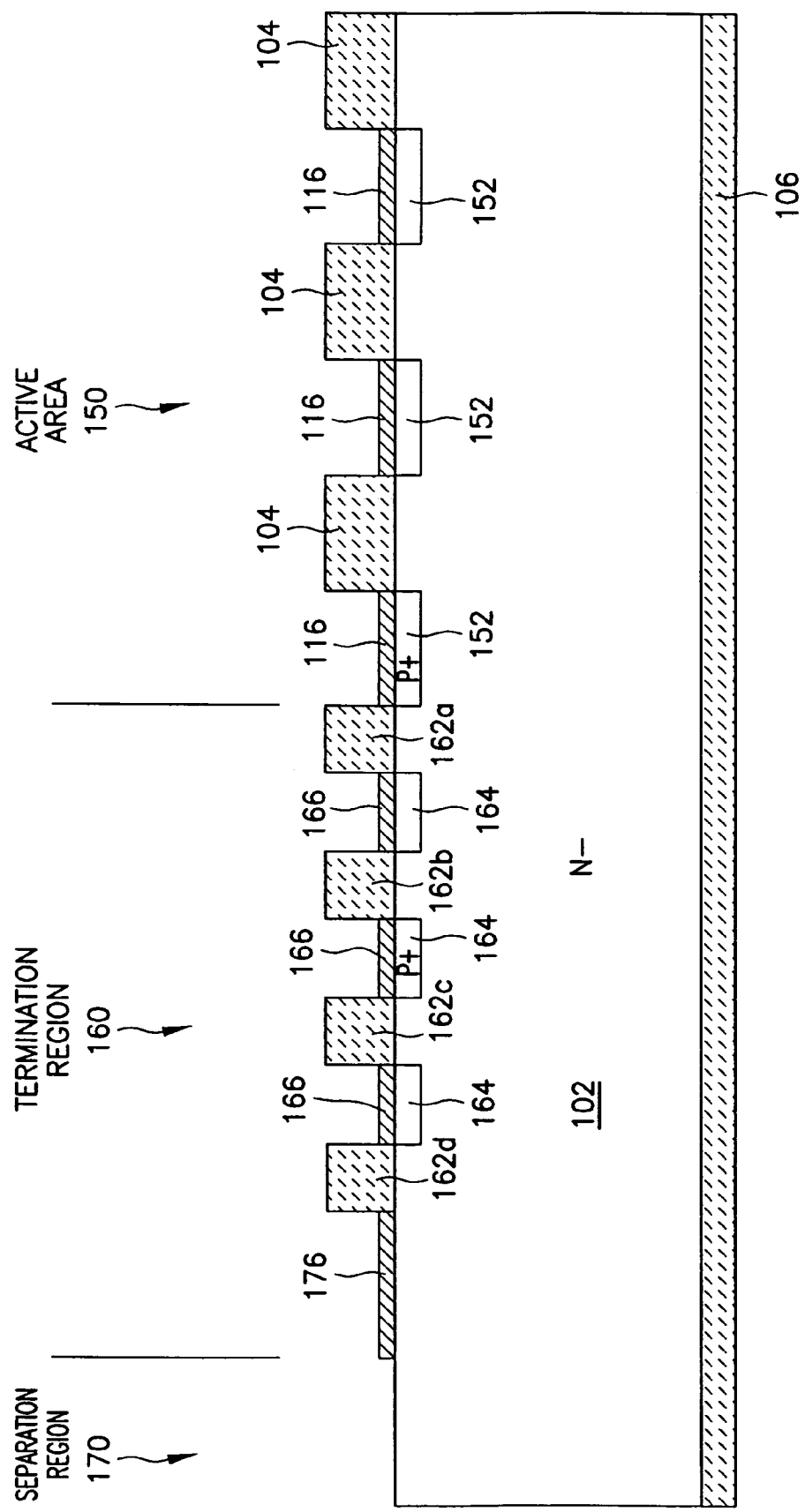
Figure 8:
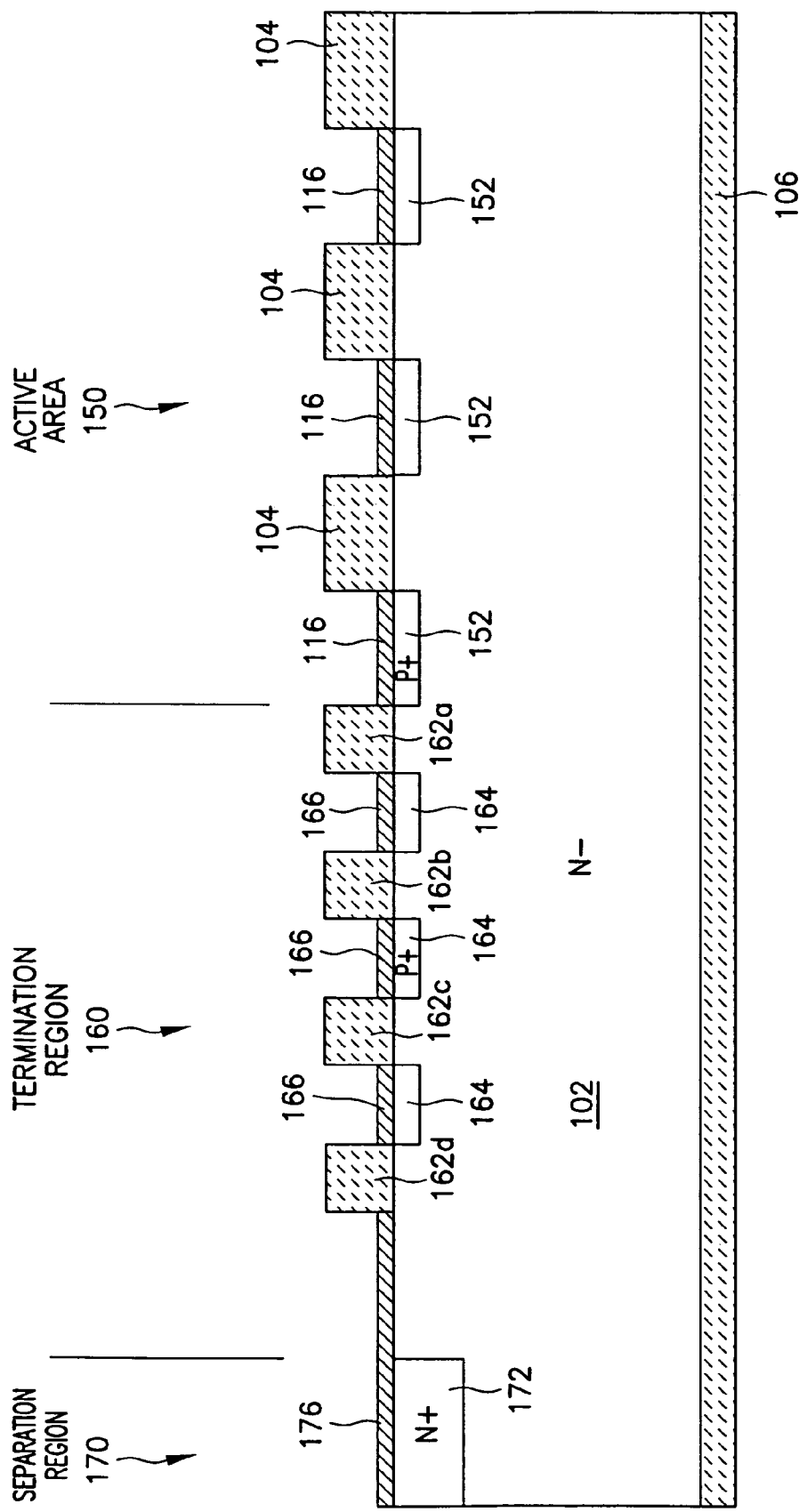

Thereafter, a second mask step is carried out to etch away oxide layer 104 within separation region/street area 170, as illustrated in FIG. 7. The resulting structure is then cleaned and a PO Cl₃ deposition is carried out to deposit PO Cl₃ within body 102 along separation region/street area 170. The resulting structure is then deglassed and cleaned. The PO Cl₃ is then diffused in a further oxidation step, forming N⁺ diffusion 172 and growing oxide layer 176 atop this diffusion, as illustrated in FIG. 8.

Figure 9:
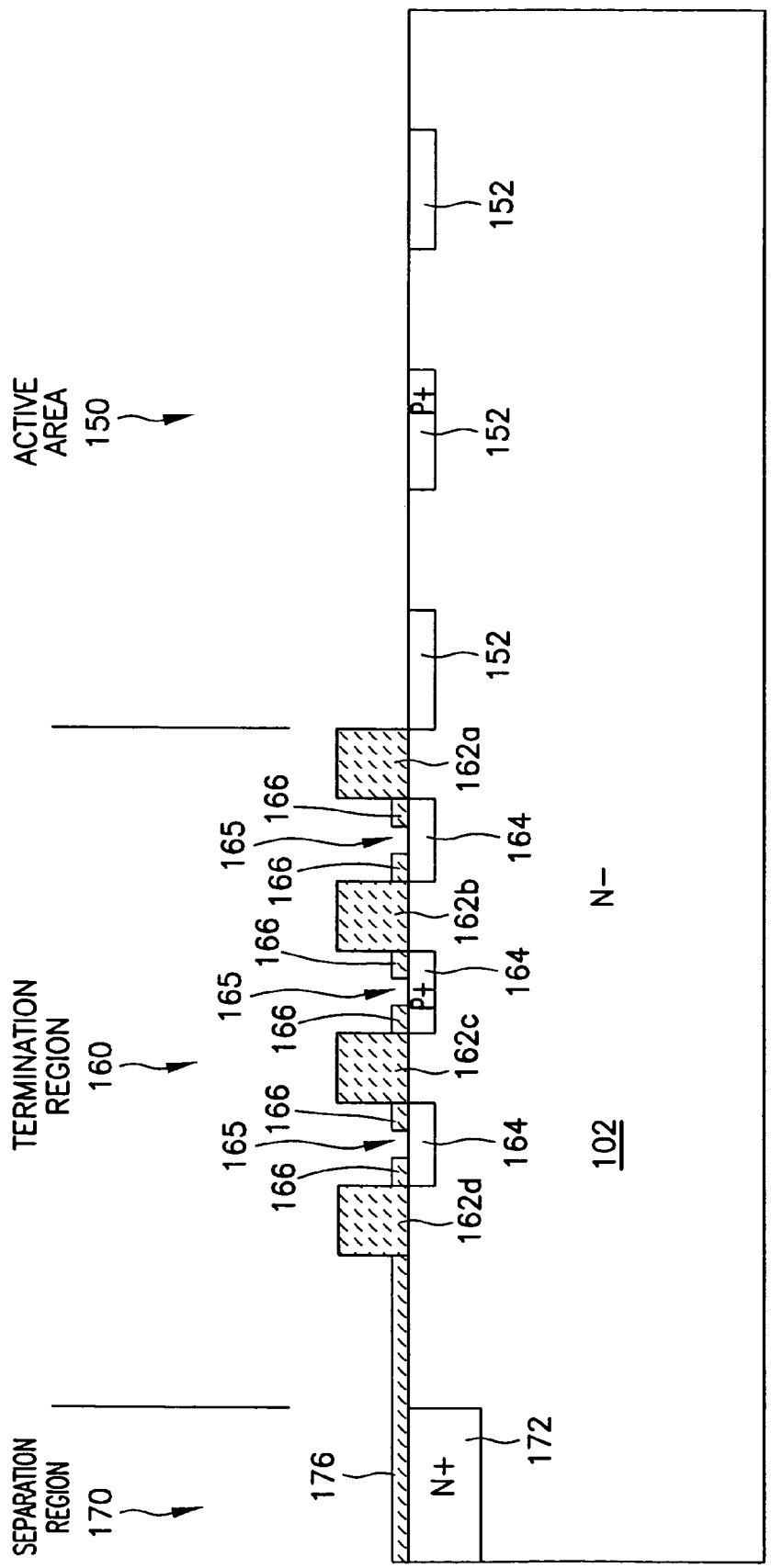

Referring to FIG. 9, a third mask step is next carried out in which, after a hard oven bake, each oxide layer 166 is etched to form windows/gaps 165. In addition, field oxide layer 104 and oxide layers 116 are stripped from atop active area 150, and field oxide layer 106 is stripped from the back surface. Thereafter, platinum may be applied to the back side of body 102 and diffused into the body to act as a life-time killer in the usual manner.

Figure 10:
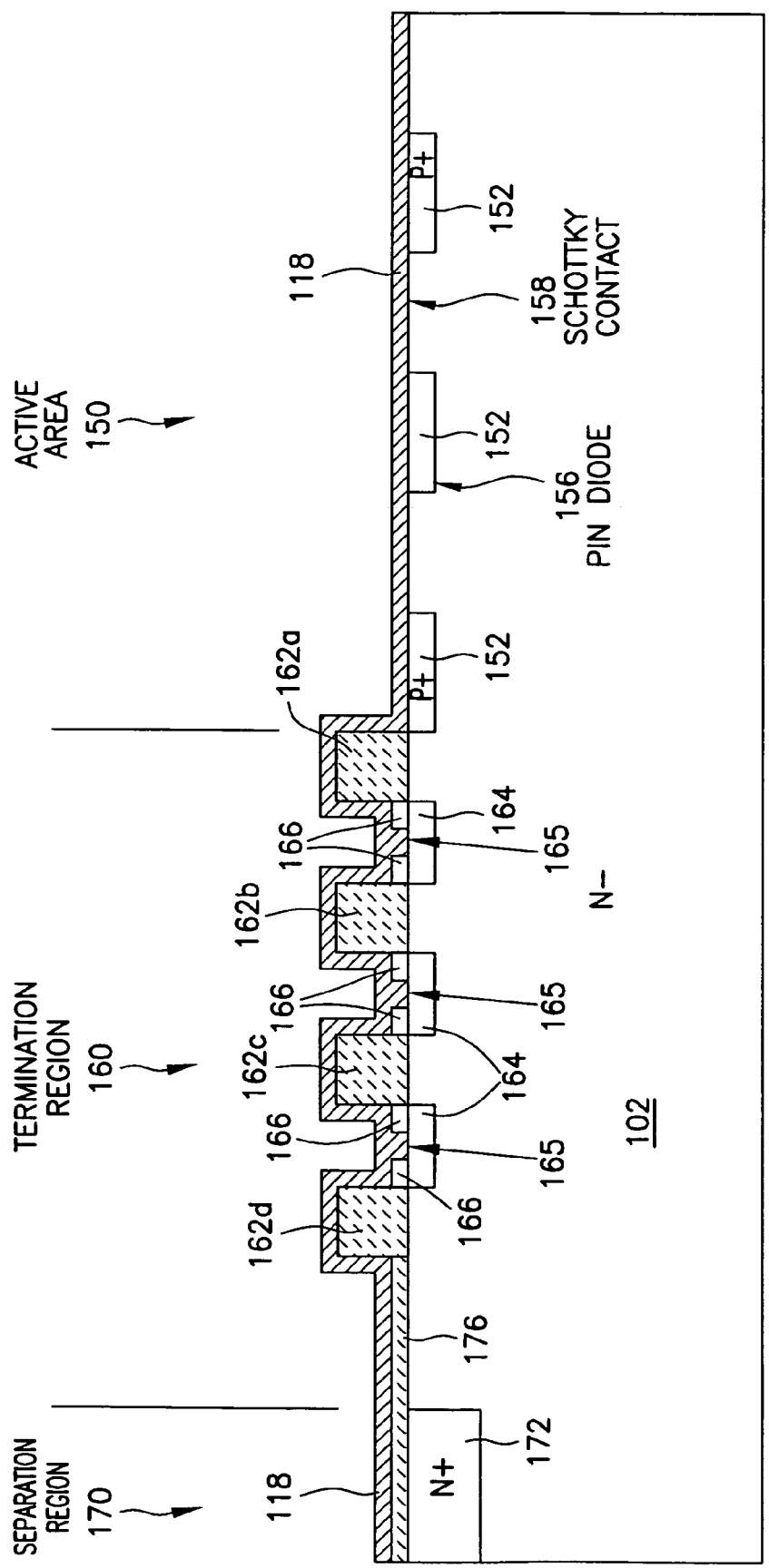

Referring to FIG. 10, the structure of FIG. 9 is next cleaned and a suitable metal layer 118, such as aluminum, is sputtered atop the structure to a thickness, for example, of 3 μm. Within active area 150, metal layer 118 contacts P+ diffusions 152, thereby defining a plurality of PiN diodes 156. Metal layer 118 also contacts the surface of N⁻ body 102 between diffusions 152, thereby defining a plurality of Schottky contacts 158. Within termination region 160, metal layer 118 extends through windows 165 and contacts guard rings 164.

Figure 11:
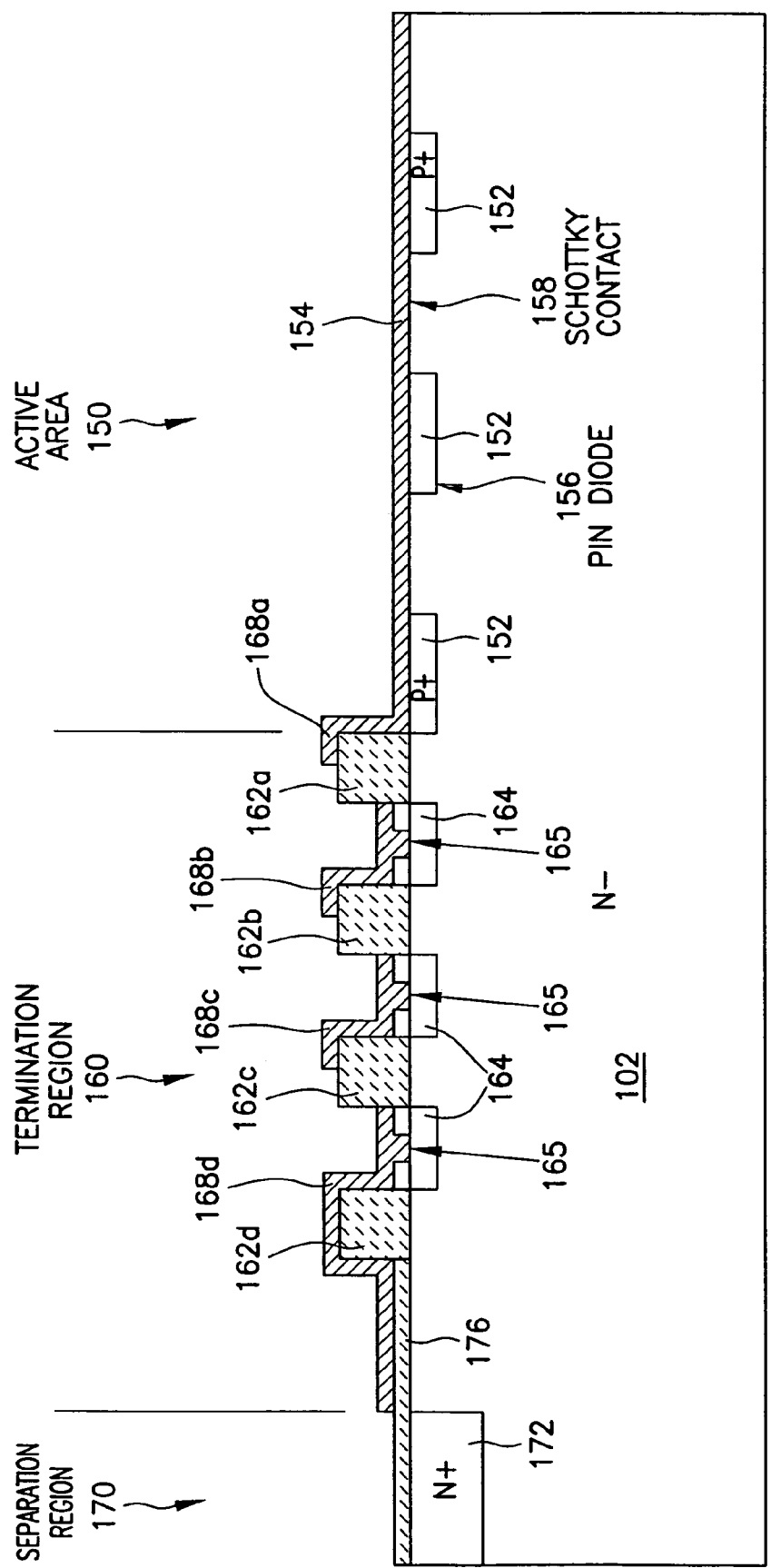

Referring to FIG. 11, a fourth mask step is next carried out in which, after a hard oven bake, metal layer 118 is etched. As a result, contact metal 154 (i.e., an anode contact) is formed along active area 150 and a series of stepped field plates 168a-d are formed over field oxide rings 162a-d, respectively. As indicated, field plate 168a contacts contact metal 154 and field plates 168b-d extend through windows 165 and contact guard rings 164.

Figure 12:
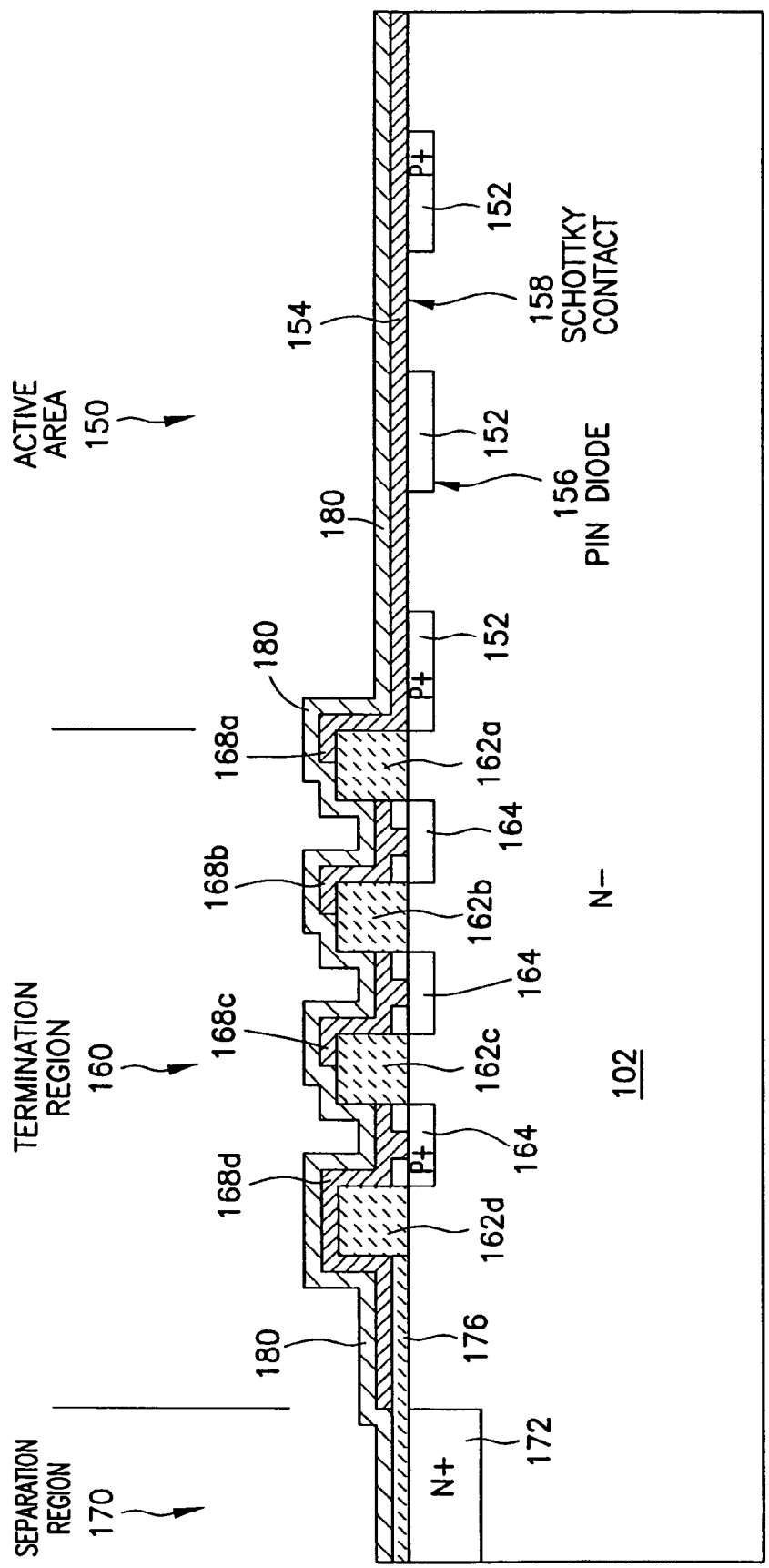

Thereafter, as shown in FIG. 12, an amorphous silicon layer 180, about 1800 Å thick for example, is deposited atop the structure of FIG. 11. Amorphous silicon layer 180 is then etched to overlie field plates 168a-d, a portion of contact metal 154, and N+ diffusion 172, as illustrated in FIG. 13.

Figure 13:
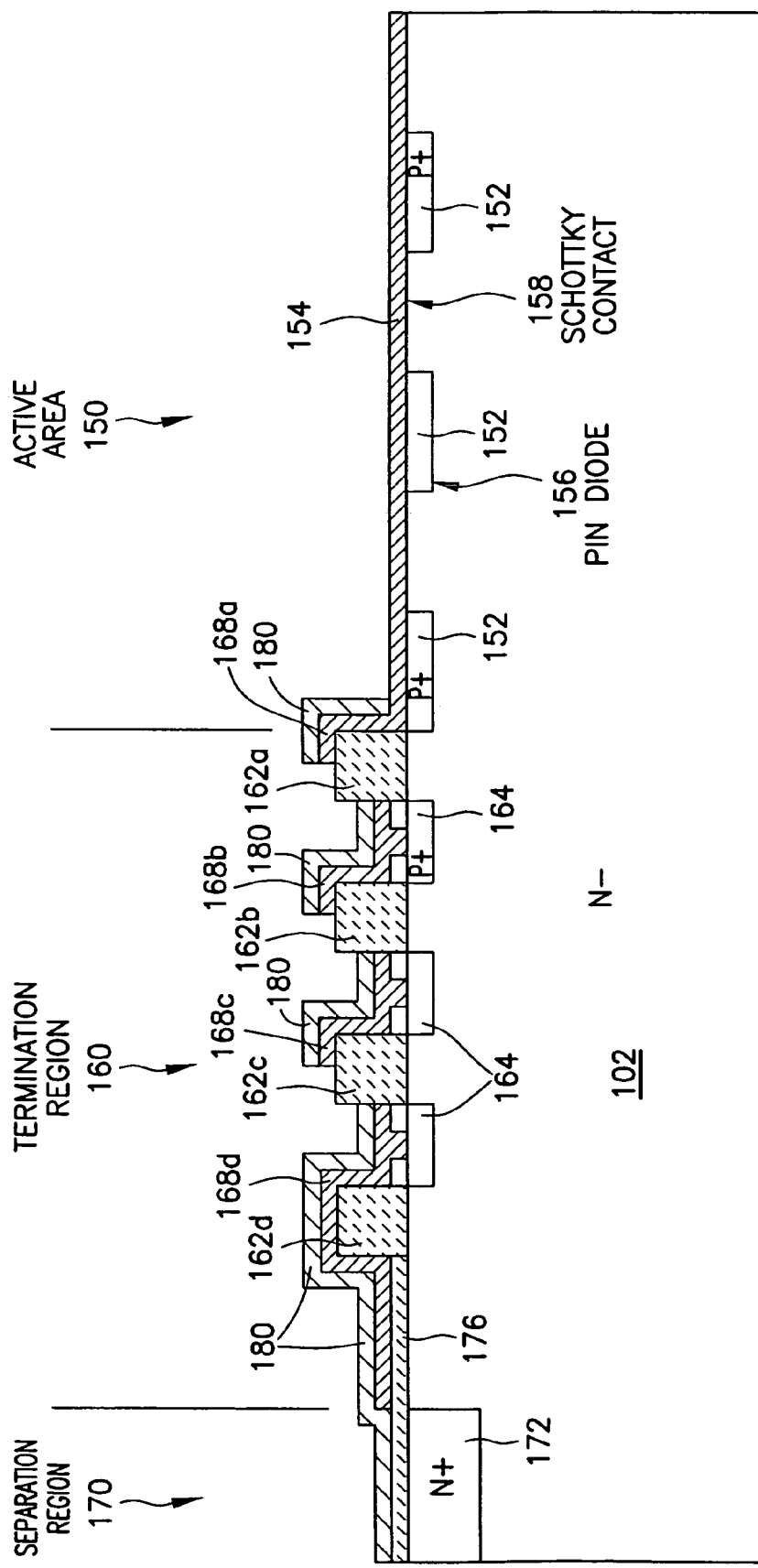

Next, the resulting structure as shown in FIG. 13 is suitably prepared and using a back grind and/or etch along the back side 182 of the structure, the silicon body is ground/thinned from about 375 μm to about 60 to 75 μm. Thereafter, back side 182 is subjected to a premetal clean.

Figure 14:
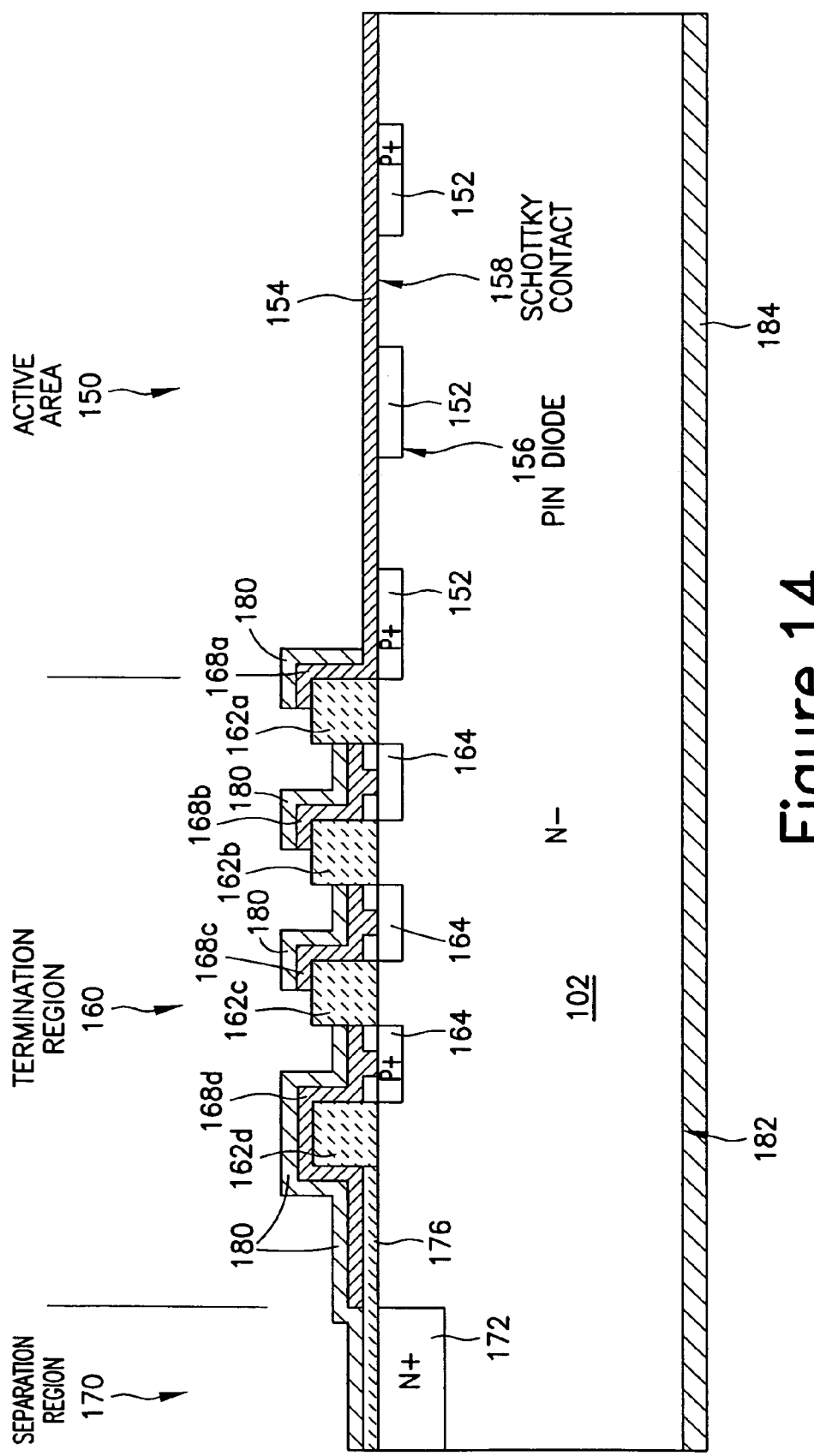
FIGS. 14 and 15 graphically illustrate a process according to an embodiment of the present invention for forming the ohmic contact structure of FIG. 1.
Figure 15:
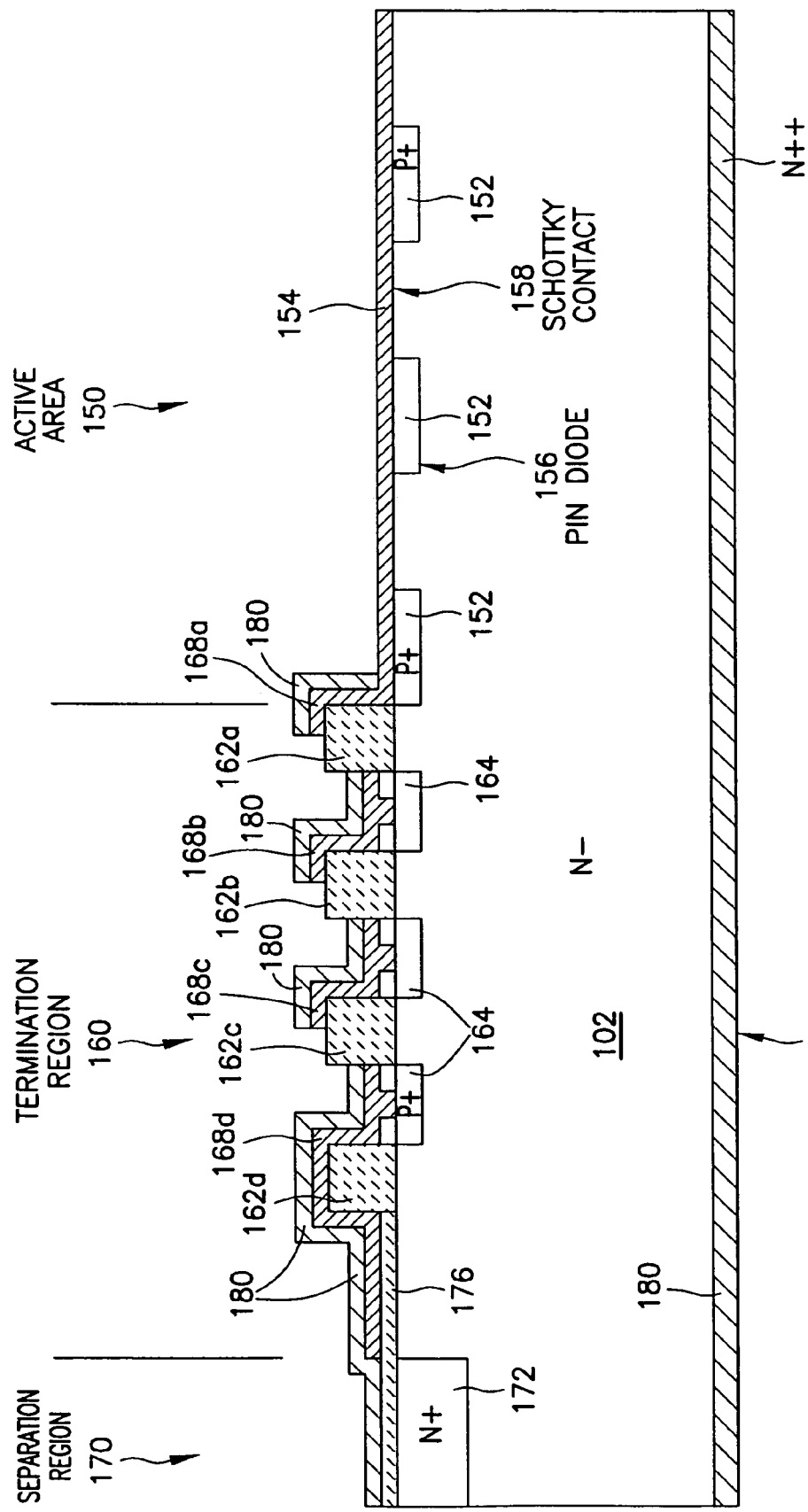

Turning now to contact metal 190, as indicated, because body 102 has N− conductivity, an ohmic contact is not easily formed between the contact metal and body 102. As such, according to an embodiment of the invention, a thin donor layer 184 that includes atoms capable of forming an intermetallic composition with low contact resistivity is first deposited on surface 182 by sputtering or evaporation, as illustrated in FIG. 14, and is thereafter sintered at a temperature less than about 500° C. As a result, a shallow intermetallic region 180 of N++ conductivity is formed within the back surface of body 102, as illustrated in FIG. 15. Note that the donor layer may not completely diffuse into body 102, however, any un-diffused material is not removed. According to a further aspect of the invention, a thin titanium layer or titanium-tungsten alloy layer (not shown), for example, can also be placed between surface 182 and donor layer 184 (in FIG. 14) to enable the use of a high sinter temperature. The titanium or titanium-tungsten layer is used as promotion adhesion for the final metal.

According to the present invention, donor layer 184 may include an alloy of gold, such as gold with arsenic (AuAs), gold with antimony (AuSb), or gold with tin (AuSn). In particular, donor layer 184 may be an alloy of gold with 0.1 to 0.5% arsenic, an alloy of gold with 10 to 30% antimony, or an alloy of gold with 10 to 30% tin.

Once intermetallic region 180 is formed, contact metal 190 is deposited over this surface thereby forming an ohmic contact, the resulting structure being shown in FIG. 1. Contact metal 190 may be a conventional thick back contact layer, such as a conventional trimetal like chromium (at 1000 Å), nickel (at 4000 Å), and silver (at 6000 Å), for example. Preferably, the depositing and heating of donor layer 184 and the depositing of contact metal 190 are performed without additional handling of the device.

Figure 16:
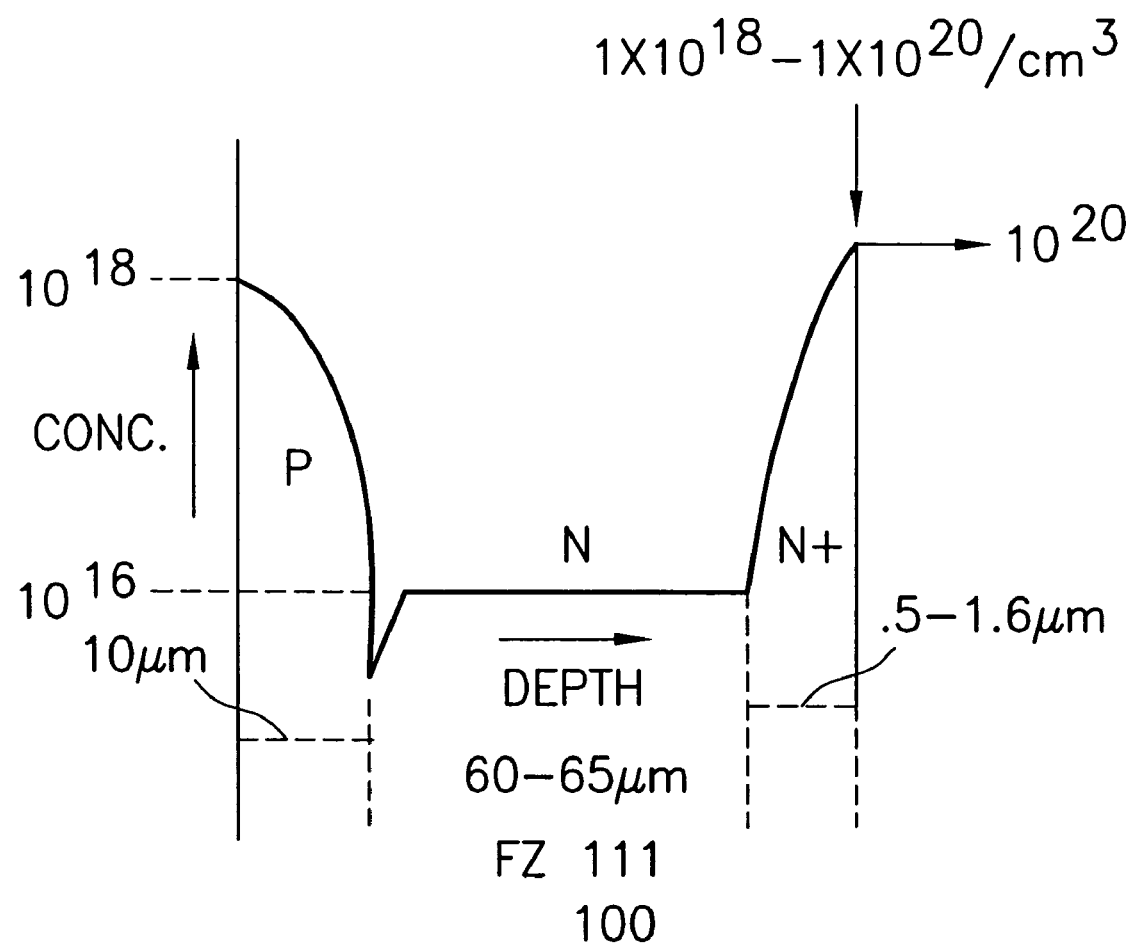
FIG. 16 is a plot of doping concentrations versus depth for the semiconductor device of FIG. 1.

Referring to FIG. 16, there is shown a plot of doping concentration versus depth into the top surface of example diode 100. As seen, the N++ intermetallic back surface 180 has a depth of about 0.5 to 1.6 μm. Accordingly, intermetallic region 180 is shallow, thereby allowing for the formation of thin devices. For example, device 100 has a total thickness of 75 μm or less. In addition, and as indicated above, intermetallic region 182 can be formed at low temperatures, less than about 500° C. The low temperature nature of the process is preferred as it will not adversely effect features already formed.

Notably, the above process for forming an ohmic contact to the back surface of a N− float zone silicon body is not limited to fast recovery diodes and is suitable to any process for forming any planar or trench type device within a lightly doped float zone silicon body.

According to a preferred embodiment of the invention, the above described process for forming an ohmic contact between a back side contact metal and a float zone silicon body can be used to apply a contact metal to a silicon carbide substrate surface. Specifically, once forming components of a device in an upper surface of a silicon carbide body, a donor layer is deposited on the back surface of the body, preferably through sputtering. The donor layer is then annealed, in situ, at 350° C. to 450° C. for a few minutes creating an intermetallic region of N+ conductivity within the back surface of the body. According to the present invention, the donor layer may include an alloy of gold, such as gold with antimony (SbAu) and in particular, gold with 30% antimony, that is sputtered to 3000 Å thick or less. Once the intermetallic region is formed, a back side contact metal, such as nickel (Ni) or an alloy of titanium, nickel, and silver (TiNiAg), is then applied to the intermetallic region to form an ohmic contact.

According to a further embodiment of the invention, the above described process for forming an ohmic contact to silicon carbide can also be used to form an ohmic contact to a gallium nitride (GaN) substrate surface. Gallium nitride is one example of a group III-V semiconductor.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for fabricating a semiconductor device, comprising the steps of:
    forming a field oxide atop an upper surface of a semiconductor body along a termination region;
    etching a plurality of windows within said field oxide thereby forming spaced field oxide rings, said plurality of windows extending to said upper surface of said body;
    forming components of the semiconductor device in said upper surface of said semiconductor body;
    using said windows to form guard rings of P type conductivity within said upper surface of said body and further forming an oxide layer over each guard ring;
    etching a window within each of said oxide layers to expose said underlying guard ring; forming separate stepped field plates over each of said field oxide rings, wherein each field plate contacts either an anode contact metal or a guard ring;
    depositing on a back surface of said semiconductor body a metallic donor layer that includes atoms capable of forming an intermetallic composition having low contact resistivity;
    heating said semiconductor body thereby forming an intermetallic region of low contact resistivity in said back surface of said body; and
    depositing a contact metal over said intermetallic region thereby forming an ohmic contact.

2. The method of claim 1, wherein said is a float zone silicon body.

3. The method of claim 2, where said heating step heats said body at approximately 500° C. or less.

4. The method of claim 2, wherein said intermetallic region has a depth of approximately 0.5 to 1.6 μm from said back surface of said body.

5. The method of claim 2, wherein said donor layer includes an alloy selected from a group consisting of AuAs, AuSb, and AuSn.

6. The method of claim 2, wherein said donor layer includes AuAs with 0.1 to 0.5% arsenic, AuSb with 10 to 30% antimony, or AuSn with 10 to 30% tin.

7. A method for fabricating a semiconductor device, comprising:
    forming a field oxide atop an upper surface of a semiconductor body along a termination region;

etching a plurality of windows within said field oxide thereby forming spaced field oxide rings, said plurality of windows extending to said upper surface of said body;

forming a plurality of spaced P type conductivity regions within said upper surface of said semiconductor body along an active region thereof;

using said windows to form guard rings of P type conductivity within said upper surface of said body and further forming an oxide layer over each guard ring;

etching a window within each of said oxide layers to expose said underlying guard ring; and forming separate stepped field plates over each of said field oxide rings:

depositing on a back surface of said semiconductor body a donor layer that includes one of AuAs alloy, AuSb alloy, an AuSn alloy;

heating said semiconductor body thereby forming an intermetallic region of low contact resistivity in said back surface of said body;

depositing a contact metal over said intermetallic region thereby forming an ohmic contact; and depositing an anode contact metal atop said upper surface along said active region such that said anode contact metal contacts said spaced P regions and said upper surface, thereby forming a plurality of PN diodes and Schottky contacts therebetween, wherein each field plate contacts either said anode contact metal or a guard ring.

8. The method of claim 7, further comprising the steps of:

forming a ring of N type conductivity within said upper surface of said body at an outer periphery of said termination region; and forming an amorphous silicon layer over each of said field plates.

9. The method of claim 7, wherein said semiconductor device has a thickness of 75 μm or less.

10. A method for fabricating a semiconductor device, comprising:

forming a field oxide atop an upper surface of a semiconductor body along a termination region;

etching a plurality of windows within said field oxide thereby forming spaced field oxide rings, said plurality of windows extending to said upper surface of said body;

forming components of the semiconductor device in said upper surface of said semiconductor body;

using said windows to form guard rings of P type conductivity within said upper surface of said body and further forming an oxide layer over each guard ring;

etching a window within each of said oxide layers to expose said underlying guard ring; and forming separate stepped field plates over each of said field oxide rings, wherein each field plate contacts either an anode contact metal or a guard ring;

depositing a first layer of titanium or titanium-tungsten on a back surface of said body;

depositing on said first layer a donor layer that includes atoms capable of forming an intermetallic composition having low contact resistivity;

heating said semiconductor body thereby forming an intermetallic region of low contact resistivity in said back surface of said body; and depositing a contact metal over said intermetallic region thereby forming an ohmic contact.

11. The method of claim 1, wherein said semiconductor body is either a silicon carbide body or a gallium nitride body.

12. The method of claim 11, where said heating step heats said body at 350° C. to 450° C.

13. The method of claim 11, wherein said donor layer includes atoms of SbAu.

14. The method of claim 11, wherein said donor layer includes atoms of SbAu with 30% antimony.

15. The method of claim 13, wherein said donor layer is deposited to a thickness of 3000 Å or less.

* * * * *